(12) United States Patent
Bonilla et al.

(10) Patent No.: US 8,298,948 B2
(45) Date of Patent: Oct. 30, 2012

(54) CAPPING OF COPPER INTERCONNECT LINES IN INTEGRATED CIRCUIT DEVICES

(75) Inventors: Griselda Bonilla, Hopewell Junction, NY (US); Kaushik Chanda, Hopewell Junction, NY (US); Ronald G. Filippi, Hopewell Junction, NY (US); Stephan Grunow, Hopewell Junction, NY (US); David L. Rath, Yorktown Heights, NY (US); Sujatha Sankaran, Hopewell Junction, NY (US); Andrew H. Simon, Hopewell Junction, NY (US); Theodorus Eduardus Standaert, Hopewell Junction, NY (US); Chih-Chao Yang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 412 days.

(21) Appl. No.: 12/613,551

(22) Filed: Nov. 6, 2009

(65) Prior Publication Data

US 2011/0108990 A1    May 12, 2011

(51) Int. Cl.
*H01L 21/44* (2006.01)
*H01L 21/302* (2006.01)

(52) U.S. Cl. ........ 438/687; 438/706; 438/712; 438/733; 438/745; 257/E21.586

(58) Field of Classification Search .................. 438/687, 438/706, 712, 733, 745; 257/E21.586
See application file for complete search history.

(56) References Cited

U.S. PATENT DOCUMENTS

| | | | |
|---|---|---|---|
| 5,611,292 A | 3/1997 | Clark et al. | |
| 6,153,935 A * | 11/2000 | Edelstein et al. | 257/773 |
| 6,207,570 B1 * | 3/2001 | Mucha | 438/692 |
| 6,420,258 B1 * | 7/2002 | Chen et al. | 438/622 |
| 6,482,741 B1 * | 11/2002 | Ueno | 438/687 |
| 6,509,267 B1 * | 1/2003 | Woo et al. | 438/687 |
| 7,651,942 B2 * | 1/2010 | Huebinger et al. | 438/639 |
| 8,158,532 B2 * | 4/2012 | Mayer et al. | 438/754 |
| 2006/0030143 A1 * | 2/2006 | Ivanov | 438/622 |
| 2006/0205204 A1 * | 9/2006 | Beck | 438/628 |
| 2007/0048991 A1 * | 3/2007 | Shih et al. | 438/597 |
| 2007/0077761 A1 * | 4/2007 | Lehr et al. | 438/687 |
| 2008/0067683 A1 | 3/2008 | Cotte et al. | |
| 2008/0102599 A1 | 5/2008 | Yang | |
| 2010/0062164 A1 * | 3/2010 | Li et al. | 427/343 |
| 2010/0133648 A1 * | 6/2010 | Seidel et al. | 257/522 |

* cited by examiner

*Primary Examiner* — Nitin Parekh
(74) *Attorney, Agent, or Firm* — Cantor Colburn LLP; Yuanmin Cai

(57) ABSTRACT

A method for capping lines includes forming a metal film layer on a copper line by a selective deposition process, the copper line disposed in a dielectric substrate, wherein the depositing also results in the deposition of stray metal material on the surface of the dielectric substrate, and etching with an isotropic etching process to remove a portion of the metal film layer and the stray metal material on the surface of the dielectric substrate, wherein the metal film layer is deposited at an initial thickness sufficient to leave a metal film layer cap remaining on the copper line following the removal of the stray metal material.

20 Claims, 4 Drawing Sheets

CAPPING OF COPPER INTERCONNECT LINES IN INTEGRATED CIRCUIT DEVICES

BACKGROUND

This invention relates generally to semiconductor processing techniques and, more particularly, to a method for plating copper interconnects in semiconductor circuits.

Interconnect lines in semiconductor wafers often comprise copper, for example, dual damascene copper interconnects disposed between interlayer dielectric materials. As current flows through the copper in the lines, electromigration of copper atoms over time degrades the integrity of the lines as copper migrates in the direction of the electron flow. The electromigration is usually most prevalent in the surface areas of the lines.

The copper material in the top surface of the lines is often capped with an electroless plated metal film such as, for example cobalt tungsten phosphide (CoWP) or a similar material. The metal capping film limits the effects of electromigration of the copper atoms in the lines.

A selective electroplating process is ideally designed to form the metal film only on regions corresponding to the copper lines. However, in actual practice, the plating process may also result in some of the metal material being formed on portions of the dielectric layer separating the copper lines. These undesired regions of plated metal atop the dielectric layer could in turn, result in a leakage of current between adjacent copper lines due to a reduced electrical resistance therebetween, which may in turn result in the shorting of the lines.

BRIEF SUMMARY

The shortcomings of the prior art are overcome by embodiments of the present invention, and advantages are achieved through capping interconnect lines using an exemplary method provided by the present invention.

A method for capping lines includes forming a metal film layer on a copper line by a selective deposition process, the copper line disposed in a dielectric substrate, wherein the depositing also results in the deposition of stray metal material on the surface of the dielectric substrate, and etching with an isotropic etching process to remove a portion of the metal film layer and the stray metal material on the surface of the dielectric substrate, wherein the metal film layer is deposited at an initial thickness sufficient to leave a metal film layer cap remaining on the copper line following the removal of the stray metal material.

An alternate method for capping lines includes depositing a metal film layer having a thickness on a copper line, the copper line disposed in a dielectric substrate, wherein the depositing results in the deposition of stray metal material on the surface of the dielectric substrate, and etching with an anisotropic etching process to remove a portion of the metal film layer and the stray metal material on the surface of the dielectric substrate, wherein the metal film layer is deposited at an initial thickness sufficient to leave a metal film layer cap remaining on the copper line following the removal of the stray metal material.

A capped copper line assembly includes a copper line disposed in a dielectric substrate, a metal film layer having arcuate profile, wherein a center portion of the metal film layer has a first thickness greater than a second thickness of edges of the metal film layer, a dielectric layer disposed on the dielectric substrate and the metal film layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Methods involving capping interconnect lines are provided.

Electromigration (EM) and Time Dependent Dielectric Breakdown (TDDB) are problematic for Dual Damascene copper (Cu) interconnects. Usually, a dielectric cap such as silicon nitride ($Si_3N_4$) or silicon carbide (SiC) is deposited on top of the interconnects to prevent Cu from diffusing into the surrounding interlayer dielectric material. Solutions have been proposed to decrease the diffusivity of Cu along this interface by selectively depositing metallic caps through processes including electroless deposition. Metal cap materials such as tantalum (Ta), cobalt tungsten phosphide (CoWP), or ruthenium (Ru) can be applied to the top interface for better EM reliability. With regard to TDDB failure, the interface between the interlayer dielectric and cap layer provides a conduction path for Cu ions to migrate from one metal line to an adjacent metal line when an electric field exists between these two lines. The selectivity and uniformity of ultrathin metal cap films has been a problem. Thus, there is a possibility of incomplete coverage of metallic films over the Cu lines. Also, residual films between metal lines may lead to electrical short between adjacent lines causing TDDB reliability problems.

Figure 1:
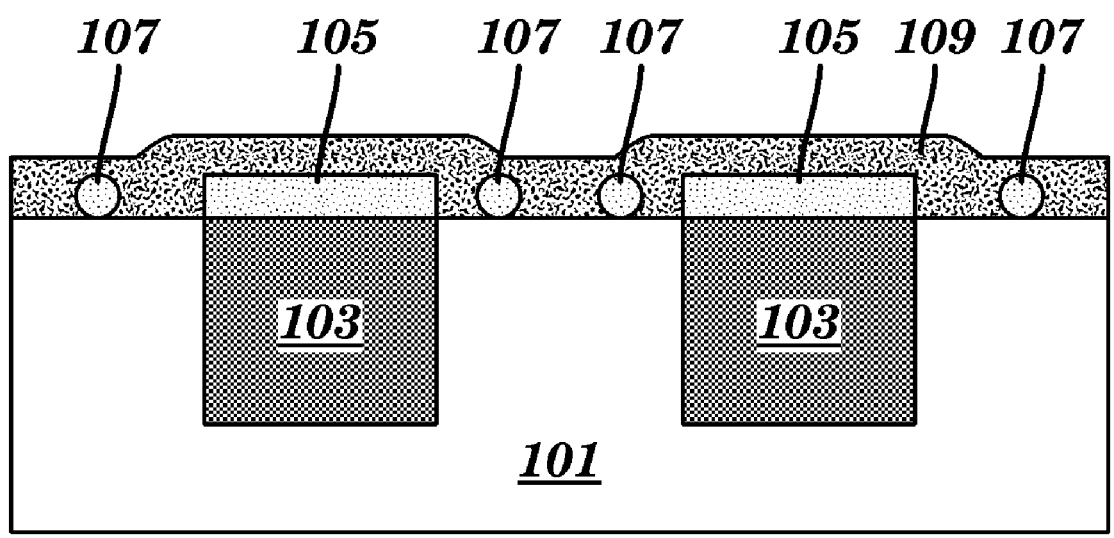
FIG. 1 illustrates a prior art process of capping lines disposed in a dielectric material.

In this regard, FIG. 1 illustrates a prior art example of a side cut-away view of lines 103 disposed in a dielectric material 101. The lines 103 may be, for example, copper interconnects on a semiconductor wafer connecting structures of a circuit on the wafer. Following damascene processing and chemical mechanical polishing (CMP) as known in the art, the copper lines 103 are then capped with a metal film 105 such as, for example, CoWP to limit the effects of electromigration caused by electric current moving through the lines 103. The metal film 105 is formed by a selective electroless plating process that is designed to form the capping metal only on the copper lines 103 and not the dielectric material 101. However, as also shown in FIG. 1, during the deposition process, undesired or stray plating material 107, for example, cobalt (Co) atoms are formed on the dielectric material 101. Conventionally, this stray plating material 107 may remain trapped atop the dielectric material, between adjacent lines 103, following the formation of a dielectric capping layer 109. The stray plating material 107 may create a low resistance, electrical leakage current path between adjacent lines, and consequently result in a short circuit between the lines 103. It is therefore desirable to be able to selectively cap the lines 103 with a metal film 105, but without causing a short between the lines 103.

Figure 2A:
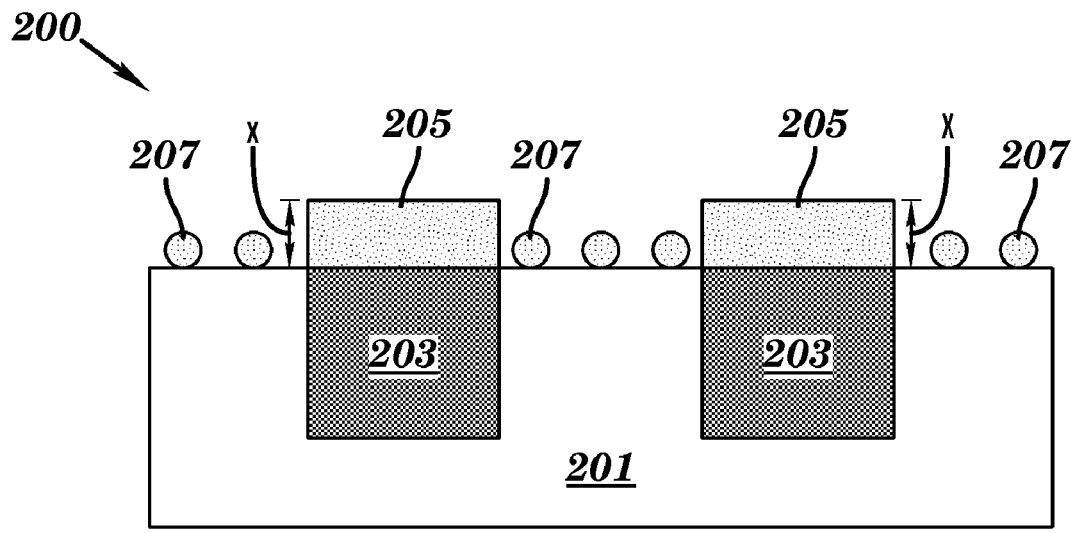
FIGS. 2A-2C illustrate an exemplary method for capping lines, in accordance with one embodiment of the invention.
Figure 2B:
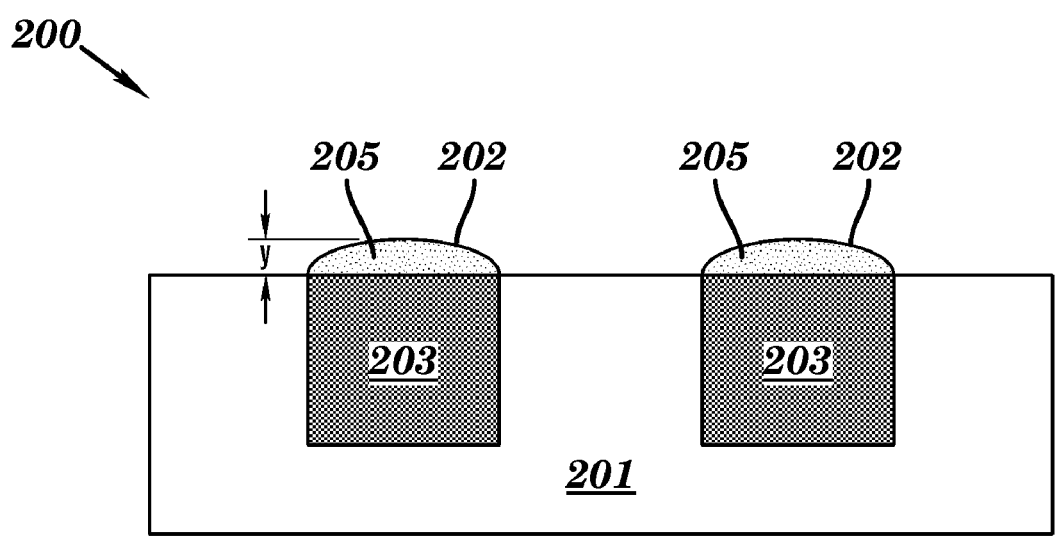
Figure 2C:
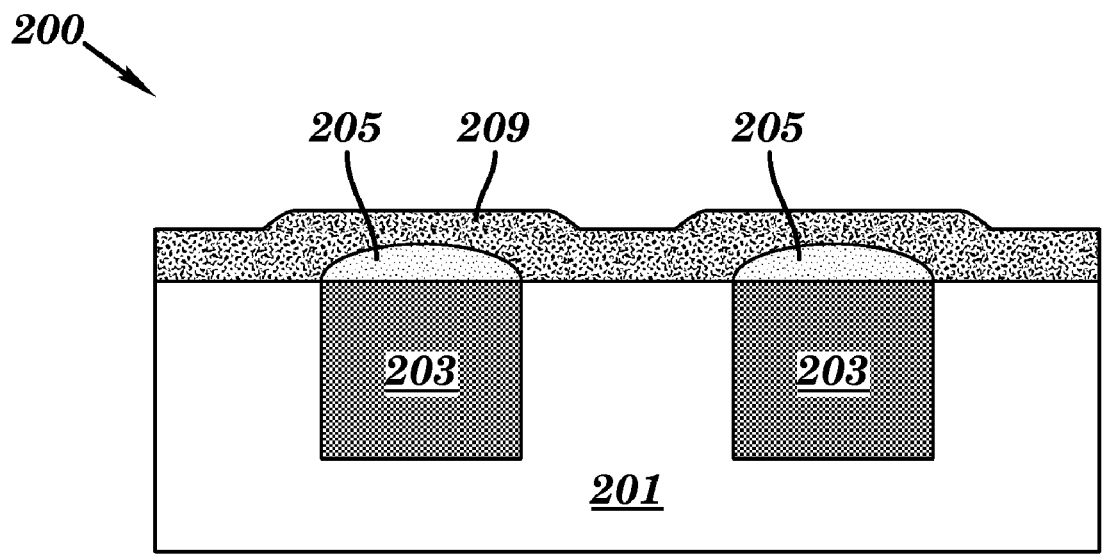

FIGS. 2A-2C illustrate an exemplary method for capping lines. Referring to FIG. 2A, a wafer portion 200 includes lines 203 disposed in a dielectric material 201 substrate. The lines 203 and the dielectric material 201 in the illustrated embodiment make up portions of a circuit on a semiconductor wafer. The lines 203 are copper, and may include other similar materials. The dielectric material 201 is, for example, a carbon doped oxide such as SiCOH. A metal film 205 such as, for example, CoWP, Ta, or Ru is deposited on the lines 203 forming caps on the lines. The metal film is deposited on the lines 203 by a suitable deposition process such as, for example, electroless plating. The metal film 205 is deposited at a thickness (x) of 100-300 angstroms. The thickness (x) may be greater than a thickness used in prior art methods. The deposition of the metal film 205 at thickness (x) may increase the amount of residual atoms that will be later removed by etching. In the illustrated embodiment residual atoms 207 e.g., Co, Ru, or Ta, have been deposited on the dielectric material 201.

Referring to FIG. 2B, the residual atoms 207 are removed by an isotropic etching process according to one embodiment of the present invention. The isotropic etching process is a non-directional chemical or plasma etching process. The isotropic etching process removes the residual atoms 207 (of FIG. 2A) and a portion of the metal film 205 resulting in the metal film 205 having a thickness (y) along the longitudinal axis of the metal film 205, and a curved profile 202 where the center of the metal film 205 is thicker than the edges of the metal film 205. The thickness (y) is between 10-100 angstroms, while the thickness of the edges of the metal film are between 10-100 angstroms, but less than the thickness (y). The curved profile 202 may improve shorts yield and reduce time dependent dielectric breakdown effects.

Referring to FIG. 2C, a dielectric capping layer 209 is deposited on the metal film 205 and the dielectric material 201 by a known deposition method.

Figure 3A:
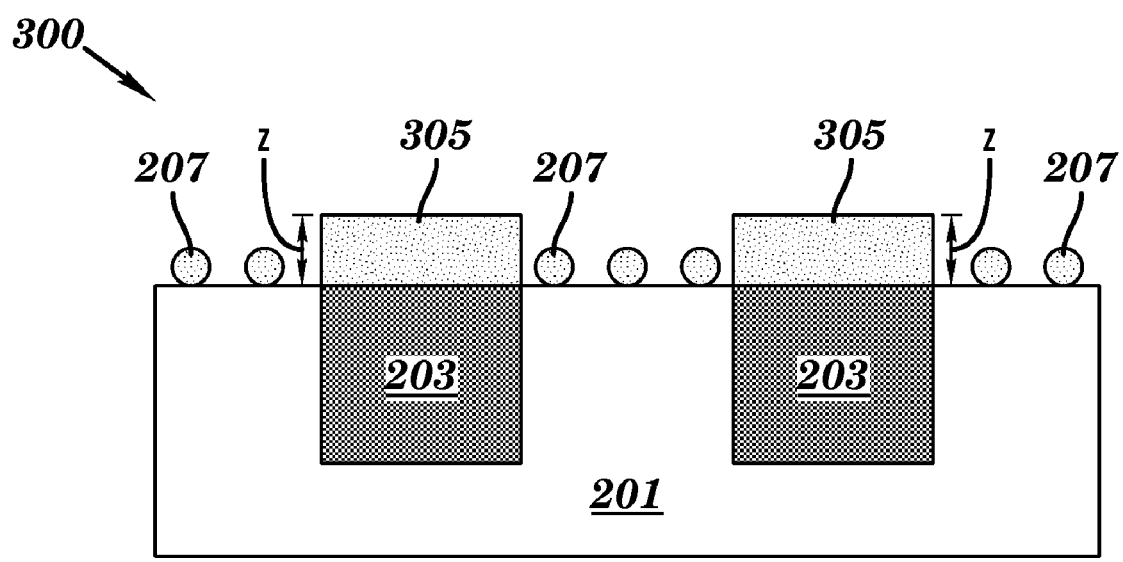
FIGS. 3A-3C illustrate an alternate exemplary method for capping lines, in accordance with a further embodiment of the invention.
Figure 3B:
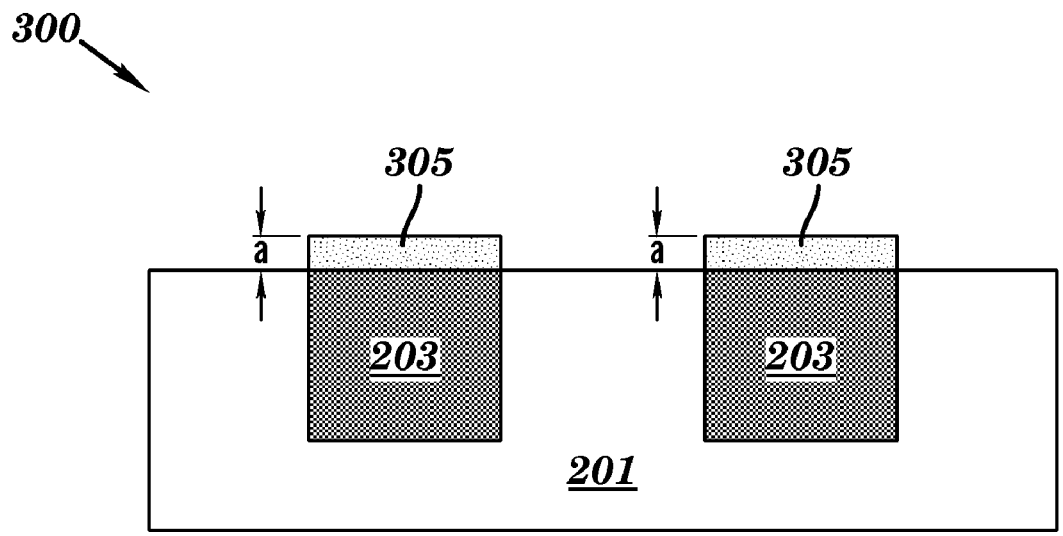

FIGS. 3A-3B illustrate an alternate exemplary method for capping lines. Referring to FIG. 3A, a wafer portion 300 includes lines 203 disposed in a dielectric material 201 with a metal film 305 deposited on the lines 203 forming caps having a thickness (z) of 100-300 angstroms on the lines in a similar manner as discussed above.

Referring to FIG. 3B, residual atoms 207 are removed by an anisotropic etching process. The anisotropic etching process removes material in a vertical plane. The anisotropic etching process removes the residual atoms 207 (of FIG. 3A) and a portion of the metal film 305 resulting in the metal film 305 having a thickness (a) of between 50 and 150 angstroms. In the illustrated embodiment of FIG. 3B the metal film 305 differs from the illustrated embodiment of FIG. 2B in that the metal film 205 of FIG. 2B has the curved profile 202.

Figure 3C:
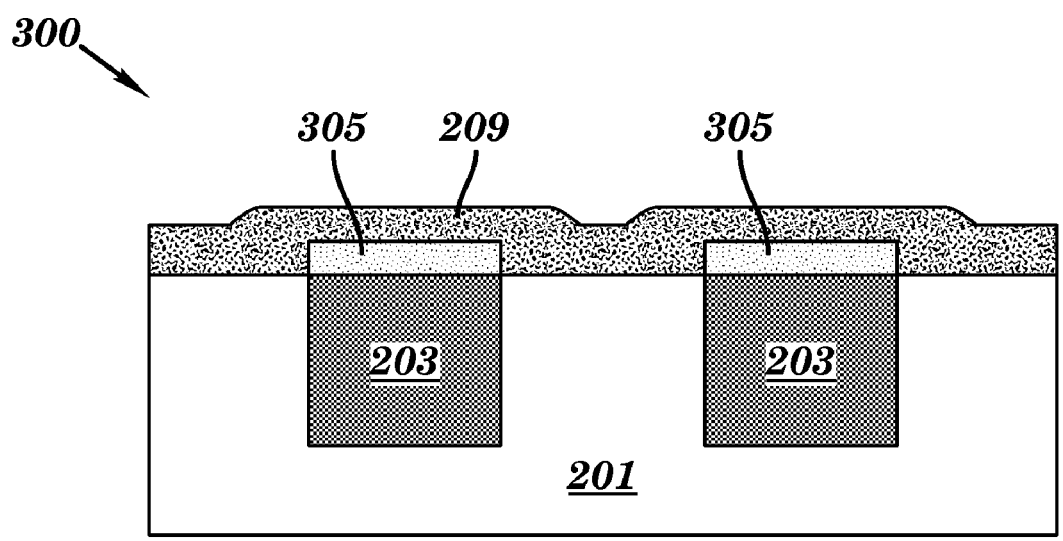

Referring to FIG. 3C, a dielectric capping layer 209 is deposited on the metal film 305 and the dielectric material 201 as described above.

The wet etching processes (isotropic etching) described above may be tailored to etch a particular metal film material, for example, a Ta metal film layer may be etched with a mixture of hydrofluoric acid (HF) and nitric acid ($HNO_3$). For example, an etchant composed of 20% HF, 40% $HNO_3$ and 40% DI water. Since the photoresist will be etched by $HNO_3$, it may be desirable to increase the concentration of the HF and eliminate the DI water in order to obtain the desired result. A Co metal film layer may be removed using, e.g., 0.2% HF+0.04% BTA (benzo-triazole)+2 ppm $CuSO_4$ that removes the oxidized residues from the dielectric and form a BTA-Cu passivation on the CoWP capped wires. A Ru metal film layer is etched with an Aqua Regia method. Alternatively a method using alkalis may also be used.

A reactive ion etching (RIE) process may also be used as the anisotropic etching process for some metal film materials. For example, a Ta metal film layer a fluorine containing gas, such as SF6, with 10% oxygen ($O_2$), may be used to etch the Ta. A Ru metal film layer may use $O_2/Cl_2$ Plasma.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for capping lines, the method comprising:
   forming a metal film layer on a copper line by a selective deposition process, the copper line disposed in a dielectric substrate, wherein the depositing also results in the deposition of stray metal material on the surface of the dielectric substrate; and
   etching with an isotropic etching process to remove a portion of the metal film layer and the stray metal material on the surface of the dielectric substrate;
   wherein the metal film layer is deposited at an initial thickness sufficient to leave a metal film layer cap remaining on the copper line following the removal of the stray metal material.

2. The method of claim 1, wherein the method further comprises depositing a layer of dielectric material on the metal film layer and the dielectric substrate after etching with the isotropic etching process.

3. The method of claim 1, wherein the metal film layer is one of Cobalt Tungsten phosphide (CoWP), tantalum (Ta), and Ruthenium (Ru).

4. The method of claim 1, wherein the dielectric substrate is a carbon doped oxide.

5. The method of claim 1, wherein the deposited metal film layer has a thickness between 100 and 200 angstroms.

6. The method of claim 1, wherein the deposited metal film layer has a thickness between 200 and 300 angstroms.

7. The method of claim 1, wherein the metal film layer has a center portion between 10 and 100 angstroms thick following the isotropic etching process.

8. The method of claim 7, wherein the metal film layer has edge portions between 10 and 100 angstroms thick and less than the thickness of the center portion following the isotropic etching process.

9. The method of claim 1, wherein the metal film layer has an arcuate profile following the isotropic etching process.

10. A method for capping lines, the method comprising:
    depositing a metal film layer having a thickness on a copper line, the copper line disposed in a dielectric substrate, wherein the depositing results in the deposition of stray metal material on the surface of the dielectric substrate; and
    etching with an anisotropic etching process to remove a portion of the metal film layer and the stray metal material on the surface of the dielectric substrate;

wherein the metal film layer is deposited at an initial thickness sufficient to leave a metal film layer cap remaining on the copper line following the removal of the stray metal material.

11. The method of claim 10, wherein the method further comprises depositing a layer of dielectric material on the metal film layer and the dielectric substrate after etching with an anisotropic etching process to remove a portion of the metal film layer and the stray metal material on the surface of the dielectric substrate.

12. The method of claim 10, wherein the metal film layer is one of: Cobalt Tungsten phosphide (CoWP), tantalum (Ta), and Ruthenium (Ru).

13. The method of claim 10, wherein the dielectric substrate is a carbon doped oxide.

14. The method of claim 10, wherein the deposited metal film layer is between 100 and 200 angstroms.

15. The method of claim 10, wherein the deposited metal film layer is between 200 and 300 angstroms.

16. The method of claim 10, wherein the metal film layer is between 50 and 150 angstroms thick following the isotropic etching process.

17. A method for capping lines, the method comprising:
forming a metal film layer on a copper line by a selective deposition process, the copper line disposed in a dielectric substrate, wherein the depositing also results in the deposition of stray metal material on and in contact with the surface of the dielectric substrate; and
etching with an etching process to remove a portion of the metal film layer and the stray metal material from the surface of the dielectric substrate;
wherein the metal film layer is deposited at an initial thickness sufficient to leave a metal film layer cap remaining on the copper line following the removal of the stray metal material.

18. The method of claim 17, wherein the etching process is an isotropic etching process.

19. The method of claim 17, wherein the etching process is an anisotropic etching process.

20. The method of claim 17, wherein the method further comprises depositing a layer of dielectric material on the metal film layer and the dielectric substrate after the etching process.

* * * * *